United States Patent
Chen et al.

(10) Patent No.: US 7,900,164 A0
(45) Date of Patent: Mar. 1, 2011

(54) STRUCTURE TO MEASURE BOTH INTERCONNECT RESISTANCE AND CAPACITANCE

(75) Inventors: Shuxian Chen, Fremont, CA (US); Jeffrey T. Watt, Palo Alto, CA (US)

(73) Assignee: Alters Corporation, San Jose, CA (US)

( * ) Notice: Subject to any disclaimer, the term of this patent is extended or adjusted under 35 U.S.C. 154(b) by 1802 days.

(21) Appl. No.: 10/759,400

(22) Filed: Jan. 16, 2004

(51) Int. Cl.
*G06F 17/50* (2006.01)

(52) U.S. Cl. ............................................. 716/4; 716/5

(58) Field of Classification Search ............... 716/4–6, 716/10–12
See application file for complete search history.

(56) References Cited

U.S. PATENT DOCUMENTS

| 6,499,129 B1 * | 12/2002 | Srinivasan et al. | 716/4 |
| 6,763,504 B2 * | 7/2004 | Rao et al. | 716/5 |
| 2004/0139406 A1 * | 7/2004 | Kasapi | 716/4 |

* cited by examiner

*Primary Examiner* — Paul Dinh
(74) *Attorney, Agent, or Firm* — Morgan, Lewis & Bockius LLP

(57) ABSTRACT

A structure for measuring both interconnect resistance and capacitance. The structure comprises a plurality of metallic interconnects, a first circuit for measuring capacitance charging current at a first interconnect and a second circuit for measuring the voltage drop between two positions at a second interconnect. The first circuit includes two electrically connected pseudo-inverters. Two control signals are fed into the two pseudo-inverters such that their associated capacitances are charged and discharged periodically. The first interconnect capacitance is determined by measuring the difference of charging currents between the two pseudo-inverters. A constant current flows through the second circuit and the interconnect resistance is determined by the voltage drop and the constant current.

14 Claims, 2 Drawing Sheets

(a)

(b)

(c)

(d)

(e)

STRUCTURE TO MEASURE BOTH INTERCONNECT RESISTANCE AND CAPACITANCE

CROSS-REFERENCE TO RELATED APPLICATIONS

"A Circuit and Method for Measuring the Capacitance of a Nonlinear Device," Ser. No. 10/759,405, filed concurrently herewith.

This application hereby incorporates by reference the entire disclosure, drawings and claims of the above-referenced application as though fully set forth herein.

FIELD OF THE INVENTION

The present invention relates generally to the field of integrated circuit design and manufacture and, in particular, to an on-chip interconnect resistance and capacitance measurement circuit.

BACKGROUND OF THE INVENTION

The semiconductor industry has witnessed dramatic improvements during the last three decades. In the early 70's, an integrated circuit (IC) manufacturer was able to cram only several thousand transistors onto a silicon chip. For example, Intel's 8-bit CPU 8080 has only about 5000 transistors. Today, it is possible to fabricate tens of millions of transistors on a single chip. For instance, Intel's Pentium 4 CPU hosts as many as 42 millions transistors. These transistors are electrically connected to each other through various metallic interconnects to accomplish many complex functionalities.

Any operation conducted by an IC can be essentially reduced to a simplified model in which a signal change at an input terminal of the IC triggers a signal change at an output terminal. For example, a flip-flop is a circuit that stores either a 0 or 1 at its output terminal. The stored value changes from 0 to 1 or 1 to 0 only when there is a signal change at its input terminal. Ideally, if there is no delay between the two signal changes at the input and output ends of an IC, an electronic device made of such an IC, e.g., a computer, can operate infinitely fast. The reality, however, is that there is a time delay between the input and output terminals of any circuit. Specifically, there are two types of sub-circuit level transmission delays contributing to the circuit-level time delay. One of them is the transistor transmission delay which is the time it takes to turn an individual transistor on/off, and the other is the interconnect transmission delay which is the time it takes a signal to travel through a metallic interconnect that connects one transistor's output terminal to another one's input terminal. As a result, the speed of an IC that comprises millions of transistors and interconnects is substantially determined by the sum of the two types of transmission delays occurring at transistor and interconnect levels. Therefore, important research topics of IC manufacture are how to determine the transmission delay of an individual interconnect and how to reduce such delay.

The transmission delay of a metallic interconnect can be estimated by $\tau \approx RC$, where R is the interconnect's parasitic resistance and C is its parasitic capacitance. Clearly, reduction of either of the two parameters can result in a smaller transmission delay. Since low resistivity metals such as copper and low permittivity (low-k) dielectric materials reduce the parasitic resistance and capacitance, respectively, of a metallic interconnect, they are being used more and more widely in IC manufacture.

However, it is not enough simply to reduce a metallic interconnect's parasitic resistance and capacitance from the perspective of circuit design. It is even more critical to know the exact resistance and capacitance values of each unique type of interconnect existing in a circuit to achieve better overall circuit performance. For example, timing analysis is an important step to guarantee that an IC operate in a pre-defined logical manner so as to produce a desired result. The accuracy of timing analysis directly relies upon the accuracy of transmission delay estimation at the metallic interconnect level, which, as suggested above, depends upon the accuracy of each interconnect's resistance and capacitance measurement.

An accurate measurement of an interconnect's resistance and capacitance also plays a critical role in solving an important IC manufacturing problem, process variation. Process variation refers to the phenomenon that the processing parameters, e.g., temperature in a wafer processing chamber, often change with time during chip fabrication. Such change may affect the uniformity and quality of chips being processed. One way of monitoring such process variation is to fabricate interconnect test structures on the wafer and measure their resistance and/or capacitance periodically. Advantageously, such test structures can be fabricated on the scribe line which is an area on the wafer between adjacent chips that is left empty of circuitry where a saw can pass and slice the chips apart.

Therefore, in both performing timing analysis and monitoring process variation, it is necessary to know both the parasitic resistance and capacitance of an interconnect. The conventional approach is to measure the two parameters separately. For example, the resistance may be measured at one interconnect and the capacitance at another interconnect. An implicit assumption of such approach is that the two interconnects are substantially similar to each other such that they are inter-changeable for the purpose of resistance and capacitance measurements, even if they are not spatially close to each other. Unfortunately, as discussed below in connection with FIG. 1, this assumption has a serious defect in the case of copper interconnects.

FIG. 1 illustrates the major steps in forming copper interconnects in a layer of inter-layer dielectric (ILD) material 100 during chip fabrication. First, a mask 110 made of photoresist material is positioned on top of ILD layer 100 (FIG. 1(a)). Mask 110 has an embedded pattern that exposes some surface areas of ILD layer 100 for etching. Next, certain etchants etch away some dielectric material from ILD layer 100 (FIG. 1(b)). After that, mask 110 is removed from the surface of ILD layer 100, leaving trenches of various shapes in the ILD layer 100 (FIG. 1(c)). For illustrative purposes, trenches 112 and 115 have an identical cross section, and the cross sections of trenches 113, 114 and 116 are also substantially similar to each other. The widths of trenches 112 and 115 are significantly larger than that of the other trenches. Compared with relatively isolated trenches 112, 115 and 116, trenches 113 and 114 are immediately next to each other. After removing mask 110, a copper layer 120 is deposited on top of ILD layer 100 to fill trenches 112–116 and cover the layer's remaining surface (FIG. 1(d)). Finally, the copper layer on the remaining surface is removed through a process called chemical/mechanical planarization (CMP). CMP is a process whereby a chemical reaction increases the mechanical removal rate of a material such as copper. The copper strips left in the trenches by CMP are metallic interconnects 122–126 that transmit signals from one transistor to another.

Mainly due to the hardness difference between the ILD material (e.g., $SiO_2$) and the copper, CMP often causes an indentation on the surface of metallic interconnects 122–126, which is also referred to as dishing effect. The extent of dishing effect, which is measured by the distance between an interconnect's surface and the upper surface of ILD layer 100's, varies from one interconnect to another. For example, as shown in FIG. 1(*e*) interconnect 125's dishing effect $h_3$ is larger than interconnect 122's dishing effect $h_1$ even though their hosting trenches have the same dimension. This may be caused by the surface non-uniformity of the tool that conducts CMP. Interconnects 123 and 124's dishing effect $h_2$ is more significant than interconnect 126's dishing effect $h_4$. This is because that the two interconnects are so close, which makes it easy to erase the in-between ILD material. As a result, different interconnects in different trenches of the same width and depth may have different parasitic capacitances and resistances.

In view of the aforementioned problems, it would be desirable to develop a structure for measuring interconnect resistance and capacitance at the same or similar location so as to achieve to an accurate estimate of interconnect transmission delay or process variation.

SUMMARY

The present invention is directed to a structure for measuring parasitic resistance and capacitance at two spatially close interconnects. The resulting interconnect resistance and capacitance measurements can be readily used to improve the accuracy of timing analysis in circuit design or to monitor process variation in chip fabrication.

A circuit comprising first and second pairs of a PMOS and an NMOS transistor is electrically coupled to one interconnect to measure its parasitic capacitance. The two pairs of transistors form two pseudo-inverters that are symmetric with each other. The PMOS and NMOS transistors in each pair are electrically connected at their drain terminals. The source terminal of the PMOS transistor is used as the input terminal of the pseudo-inverter and the source terminal of the NMOS transistor as its output terminal. The gate terminals of the two transistors receive separate periodic control signals from a signal generator. The separate periodic control signals are arranged to form a charging period and a discharging period within each period such that no more than one of the PMOS and NMOS transistors in each pair conducts current at any given time. The charging and discharging periods are long enough for the two pseudo-inverters to fully charge and discharge their associated capacitors. The interconnect's parasitic capacitance is then determined by measuring the current difference between the two pseudo-inverters.

Another circuit is electrically coupled to an interconnect that is spatially close to the one used for capacitance measurement. This circuit comprises a power supply that provides a constant direct current (DC) of known magnitude to the interconnect and a voltmeter that measures a voltage drop between two positions on the interconnect. This interconnect's resistance is then determined according to Ohm's law based on the voltage drop and the direct current.

One advantage of the present invention is that the measured parasitic resistance (or capacitance) at one interconnect can be treated as the parasitic resistance (or capacitance) at the other interconnect with little error. The reason is that the two interconnects have experienced similar processing conditions since they are spatially close and the widths and thicknesses of the interconnects are substantially the same since the dishing effects on the two interconnects are substantially the same.

Another advantage is that it is possible to measure both interconnect resistance and capacitance on one compact testing structure according to the present invention. As a result, one testing wafer can host more testing structures to measure the interconnect resistance and capacitance of various configurations. Thus, the silicon area in the scribe line can be more efficiently used to monitor the process variation accurately.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings wherein.

Like reference numerals refer to corresponding parts throughout the several views of the drawings.

DESCRIPTION OF EMBODIMENTS

The present invention relates to a structure for measuring parasitic resistance and capacitance of spatially close interconnects. Such information can be used in timing analysis for circuit design and in monitoring process variation during chip fabrication.

Figure 1:
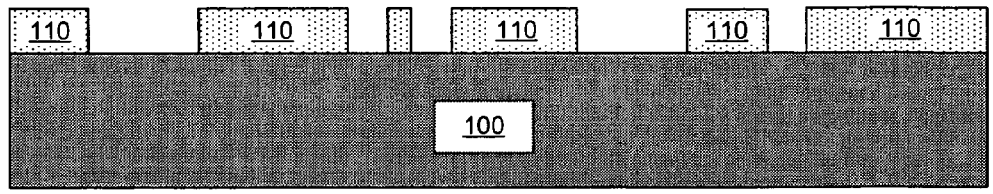
FIG. 1 illustrates major steps of forming copper interconnects in a layer of inter-layer dielectric (ILD) material during semiconductor fabrication.
Figure 1:
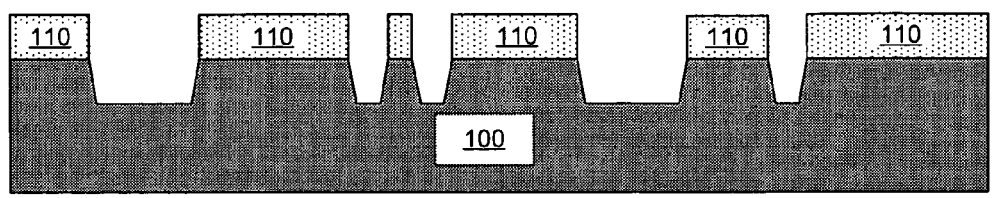
Figure 1:
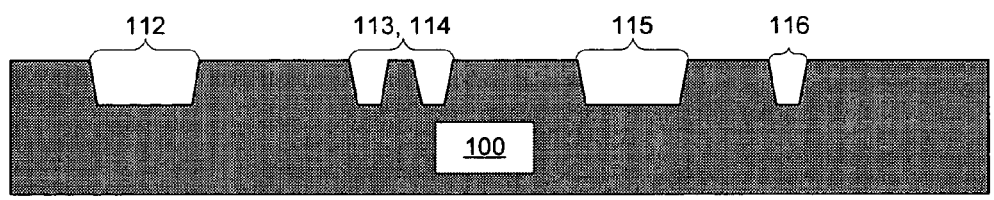
Figure 1:
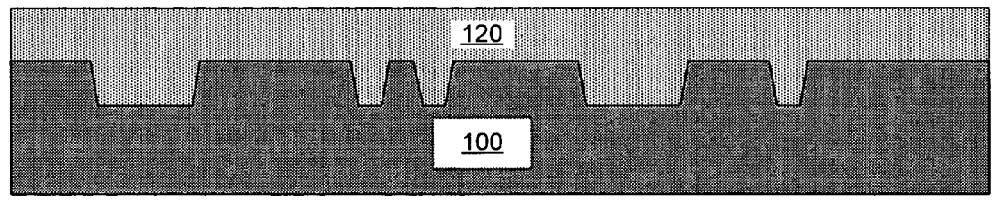
Figure 1:
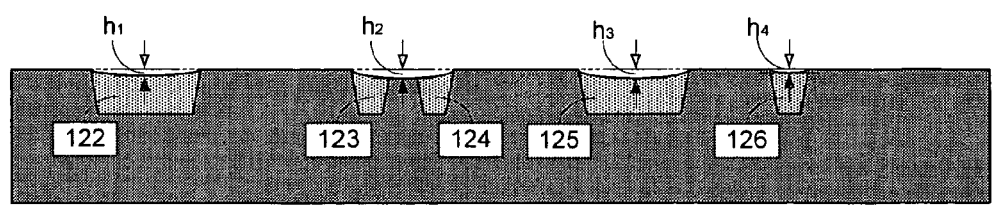
Figure 2:
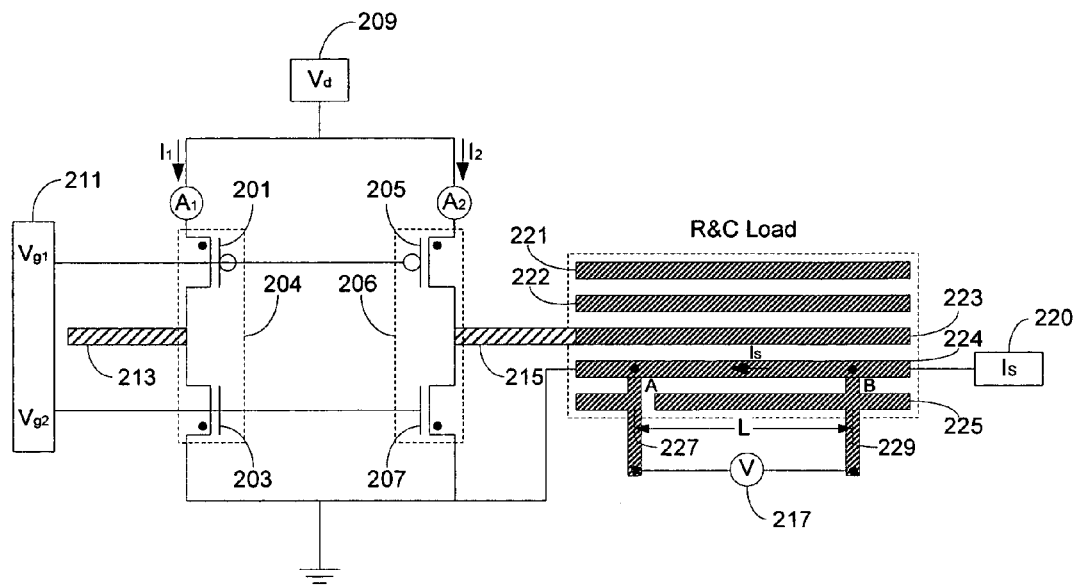
FIG. 2 is a structure for testing both parasitic resistance and capacitance of two immediately adjacent interconnects according to the present invention.

FIG. 2 depicts a structure for testing both parasitic resistance and capacitance of two immediately adjacent interconnects according to the present invention. In the dash line box titled "R&C Load" is a dense trench area including a plurality of parallel interconnects. In particular, this dense trench area comprises five parallel interconnects 221–225. The interconnect 223 in the middle is usually the one that carries signal and therefore it is critical to estimate interconnect 223's resistance and capacitance accurately. The surrounding interconnects are either floating or grounded for various technical reasons.

If all the four surrounding interconnects are grounded, the measured capacitance of interconnect 223 according to the present invention is referred to as "total capacitance". If any of the four surrounding interconnects is floating, the measured capacitance according to the present invention is referred to as "partial capacitance". An interconnect's partial capacitance is always smaller than its total capacitance. Therefore, the same R&C load structure in FIG. 2 may have different capacitances depending on how many surrounding interconnects are floating/grounded and which surrounding interconnects are floating/grounded. In practice, there are often multiple copies of a same R&C load structure fabricated on a testing wafer, each having a unique configuration and therefore a unique capacitance.

An important assumption of the present invention is that the interconnects within a same R&C load structure are assumed to be substantially similar to each other since they are spatially so close to each other and are formed by the same set of processing procedures. Using the R&C load structure in FIG. 2 as an example, it is no longer necessary to measure the interconnect 223's resistance directly to estimate the corresponding transmission delay. The resistance of an immediately adjacent interconnect 224 that has substantially the same dimensions is a sufficiently accurate estimate of the resistance of interconnect 223. In this particular example, the distance between the two immediately adjacent interconnects is approximately 9 microns. Therefore, the transmission delay at interconnect 223 can be estimated based on interconnect 224's resistance and interconnect 223's capacitance.

It will also be apparent to those skilled in the art that the present invention applies to a R&C load structure having an arbitrary number of interconnects, e.g., as few as two adjacent interconnects. From a practical perspective, since the capacitance decreases significantly with the increase of distance between conductors, a R&C load structure having more than five interconnects usually has the same capacitance as the one shown in FIG. 2.

A circuit for measuring the parasitic capacitance of interconnect 223 comprises a first pair of a PMOS transistor 201 and an NMOS transistor 203 and a second pair of a PMOS transistor 205 and an NMOS transistor 207. Each such pair of transistors forms a pseudo-inverter 204, 206. The two source terminals of PMOS transistors 201 and 205 are electrically connected to a signal generator 209. The signal generator 209 provides a constant power supply signal $V_d$ to the two pseudo-inverters. The two source terminals of NMOS transistors 203 and 207 are electrically connected to ground. Unlike a regular CMOS inverter in which the two gate terminals are electrically connected together as the inverter's input terminal, the two gate terminals of the pseudo-inverters 204 and 206 are not electrically connected. Instead, the two gate terminals are electrically connected to a signal generator 211. The signal generator 211 provides two control signals, one signal $V_{g1}$ determining the state of the two PMOS transistors 201 and 205 and the other signal $V_{g2}$ determining the state of the two NMOS transistors 203 and 207. Two identical metal lines 213 and 215 are electrically connected to the drain terminals of the transistors, respectively. Metal lines 213, 215 serve as reference capacitors. Metal line 215 is further connected to interconnect 223.

Since the two metal lines 213 and 215 have identical structures, they are assumed to have identical parasitic capacitance. Similarly, the two pseudo-inverters 204 and 206 are also assumed to have the same parasitic capacitance because of their symmetric structure. Therefore, the only capacitance difference between the left and right halves of the circuit is the parasitic capacitance of interconnect 223.

Figure 3:
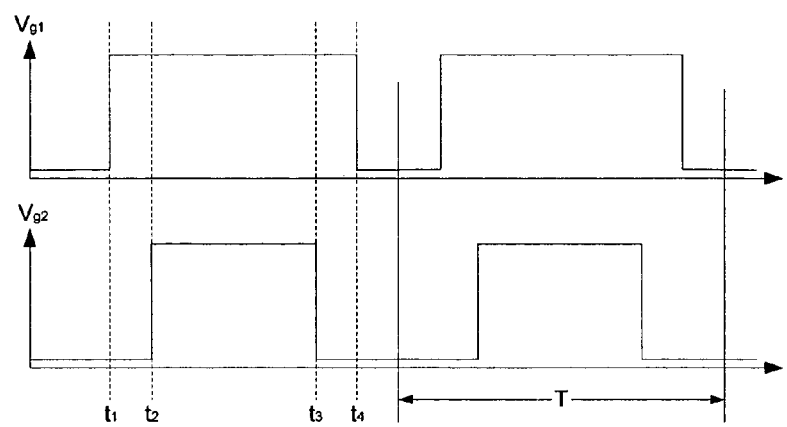
FIG. 3 depicts two timing diagrams needed for measuring the parasitic capacitance of one interconnect.

To measure interconnect 223's parasitic capacitance, the signal generator 211 operates in such a manner that no more than one transistor in any pseudo-inverter is on at any given time. Therefore, any short circuit between the signal generator 209 and the ground is avoided. FIG. 3 depicts two timing diagrams that satisfy such requirement. The two signals $V_{g1}$ and $V_{g2}$ generated by the signal generator 211 have a same frequency 1/T. At the beginning, both $V_{g1}$ and $V_{g2}$ are at a low voltage level. As a result, PMOS transistors 201 and 205 are on and currents are drawn from power supply $V_d$ to charge up the parasitic capacitances of metal lines 213 and 215 as well as interconnect 223.

Two DC ammeters $A_1$ and $A_2$ located between power supply $V_d$ and the two PMOS transistors 201 and 205 measure the two charging currents $I_1$ and $I_2$, respectively. After the capacitances are fully charged at $t_1$, control signal $V_{g2}$ switches to a high voltage level and therefore turns off the two PMOS transistors. A period from $t_1$ to $t_2$ is a transition period during which no transistor is on and there is no current in any part of the circuit (ignoring leakage current). At $t_2$, control signal $V_{g2}$ switches to a high voltage level which turns on NMOS transistors 203 and 207. Since the source terminals of the two NMOS transistors are grounded, the parasitic capacitances of the circuit are completely discharged during the period from $t_2$ to $t_3$. Signal $V_{g2}$ drops to a low voltage level at $t_3$ which turns off both NMOS transistors. The period between $t_3$ and $t_4$ is another transition period similar to the previous transition period. At $t_4$, signal $V_{g1}$ also drops to a low voltage level and turns on the two PMOS transistors. A new round of charging and discharging the circuit's parasitic capacitance begins.

In another embodiment, the two DC ammeters A1 and A2 are positioned between the source terminals of the two NMOS transistors and the ground to measure the discharging current.

Assuming that the parasitic capacitance associated with metal lines 213 and 215 is C' and the parasitic capacitance associated with interconnect 223 is C, the charging currents $I_1$ and $I_2$ are given by:

and $$I_1 = \frac{C' \cdot V_d}{T},$$

$$I_2 = \frac{(C+C') \cdot V_d}{T}.$$

Therefore, interconnect 223's capacitance C can be expressed as:

$$C = \frac{(I_2 - I_1) \cdot T}{V_d}.$$

To get a more reliable and accurate value of interconnect 223's capacitance C, it is preferred to use multiple combinations of different power supply signals $V_d$ and different periods T for the two control signals. In one embodiment, power supply $V_d$ is selected from a range from 2V to 5V and T from a range from 0.2 µs to 1 µs. For each combination, an estimated C is derived from the formula discussed above. The estimated capacitances from the multiple combinations are then averaged as the interconnect's capacitance C.

To measure the interconnect's resistance R, the circuit of FIG. 2 also includes a signal generator 220 that produces a constant direct current. During the interconnect capacitance measurement discussed above, signal generator 220 is turned off to avoid any interference with the capacitance measurement. During the interconnect resistance measurement, the signal generator 220 is turned on and signal generators 209 and 211 preferably are turned off.

During the interconnect resistance measurement, an electrical current of a known magnitude $I_s$ flows through interconnect 224. Two positions A and B are identified on interconnect 224 that are separated by a distance L. In one embodiment, a metal line 227 or 229 branches out from each of the two positions. Since metal lines 227 and 229 belong to the same metal layer as the other interconnects, each of them intersects with interconnect 225. To avoid current $I_s$ from dividing into two branches following through parallel interconnects, interconnect 225 is not continuous as indicated by the gap under position A. The other end of each metal line 227 or 229 is electrically connected to a voltmeter 217 that measures the voltage drop from position A to B. In another embodiment, voltmeter 217 is electrically connected to positions A and B directly if interconnect 224 is wide enough.

Note that there is no current in the metal lines 227 and 229 because voltmeter 217 has a high resistance. According to Ohm's law, the interconnect resistance between A and B is $$R = \frac{(V_B - V_A)}{I_S}.$$

The method of resistance measurement discussed above is also referred to as Kelvin method. Once the interconnect resistance and capacitance are known, they can be used to estimate the transmission delay at any interconnect having similar geometry parameters and physical structures in a timing analysis or to monitor the process variation during chip fabrication.

In one embodiment, various interconnect structures of different specifications according to FIG. 2 are fabricated on a testing wafer. Their respective capacitances and resistances are measured and these results are stored in a computer database for use during future timing analyses use. Alternatively, the two parameters are measured periodically or whenever necessary in testing structures located on the scribe line of a production wafer. Such information can be used to monitor the process variation.

The foregoing description, for purpose of explanation, has been set forth with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An on-chip interconnect resistance and capacitance measurement structure, comprising:
   a plurality of spatially adjacent interconnects;
   a first circuit electrically connected to a first reference capacitor and a first interconnect of the plurality of interconnects;
   a second circuit electrically connected to a second reference capacitor and the first circuit, the first and second circuits having a similar physical structure and an input, an output and two control terminals;
   a first signal generator for driving the two circuits simultaneously through their input terminals;
   a second signal generator for driving the two circuits through their two control terminals; and
   a third signal generator for driving a second interconnect of the plurality of interconnects;
   wherein the capacitance of the first interconnect is determined by measuring a current difference between the two circuits and the resistance of the second interconnect is determined by measuring a voltage drop between two positions having a known distance on the second interconnect when the third signal generator feeds a known current into the second interconnect.

2. The structure of claim 1, wherein the first and second reference capacitors are substantially similar to each other.

3. The structure of claim 2, wherein the first and second reference capacitors are two identical metal strips.

4. The structure of claim 1, wherein each of the two circuits comprises a PMOS transistor and an NMOS transistor that are electrically connected through their drain terminals to form a pseudo-inverter in which a source terminal of the PMOS transistor is said input terminal, a source terminal of the NMOS transistor is said output terminal and the two gate terminals are said two control terminals.

5. The structure of claim 4, wherein the second signal generator outputs two signals having a same frequency and first and second periods, a first of the two signals being fed into the gate terminal of the PMOS transistor and a second of the two signals being fed into the gate terminal of the NMOS transistor.

6. The structure of claim 5, wherein the two signals are arranged such that no more than one of the two transistors in each pair conducts current at a given time, and the PMOS transistor is on and the NMOS transistor is off during the first period and PMOS transistor is off and the NMOS transistor is on during the second period.

7. The structure of claim 5, wherein the first period is long enough for the reference capacitors and the first interconnect to be fully charged and the second period is long enough for the reference capacitors and the first interconnect to be fully discharged.

8. The structure of claim 5, wherein there is a transition period between the first period and the second period, and both the PMOS and NMOS transistors are off during the transition period.

9. The structure of claim 1, wherein the third signal generator is off when the first and second signal generators are on.

10. The structure of claim 1, wherein the first and second signal generators are off when the third signal generator is on.

11. The structure of claim 10, wherein the third signal generator provides a constant direct current to the second interconnect and the resistance between the two positions on the second interconnect is determined according to Ohm's law.

12. The structure of claim 1, wherein the plurality of interconnects are made of copper.

13. The structure of claim 1, wherein the plurality of interconnects and the first and second circuits are fabricated on a testing wafer and the measured interconnect resistance and capacitance are used for estimating a transmission delay at any of the plurality of interconnects.

14. The structure of claim 1, wherein the plurality of interconnects and the first and second circuits are fabricated on a scribe line of a production wafer and the measured interconnect resistance and capacitance are used for monitoring process variation.

* * * * *

UNITED STATES PATENT AND TRADEMARK OFFICE
CERTIFICATE OF CORRECTION

| | | |
|---|---|---|
| PATENT NO. | : 7,900,164 B1 | Page 1 of 1 |
| APPLICATION NO. | : 10/759400 | |
| DATED | : March 1, 2011 | |
| INVENTOR(S) | : Shuxian Chen | |

It is certified that error appears in the above-identified patent and that said Letters Patent is hereby corrected as shown below:

ON THE TITLE PAGE:

Item (73), delete "Alters Corporation" and substitute therefor --Altera Corporation--.

Signed and Sealed this

Second Day of October, 2012

David J. Kappos
*Director of the United States Patent and Trademark Office*